United States Patent
Tseng et al.

(10) Patent No.: US 8,161,638 B2
(45) Date of Patent: Apr. 24, 2012

(54) MANUFACTURING METHOD OF CIRCUIT STRUCTURE

(75) Inventors: Tzyy-Jang Tseng, Hsinchu (TW); Chang-Ming Lee, Taoyuan County (TW); Wen-Fang Liu, Taoyuan County (TW); Cheng-Po Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 176 days.

(21) Appl. No.: 12/783,806

(22) Filed: May 20, 2010

(65) Prior Publication Data
US 2011/0100543 A1    May 5, 2011

(30) Foreign Application Priority Data
Oct. 29, 2009   (TW) ................................ 98136682 A (51) Int. Cl.
*H01K 3/10*   (2006.01)
(52) U.S. Cl. ................ 29/852; 29/830; 29/846
(58) Field of Classification Search ............ 29/825, 29/830, 846, 852
See application file for complete search history.

(56) References Cited

U.S. PATENT DOCUMENTS

| | | | | |
|---|---|---|---|---|
| 4,642,160 A * | 2/1987 | Burgess | ............ | 216/18 |
| 5,010,641 A * | 4/1991 | Sisler | ............ | 29/830 |
| 5,061,548 A * | 10/1991 | Arthur et al. | ............ | 428/209 |
| 5,302,547 A | 4/1994 | Wojnarowski et al. | ......... | 216/41 |
| 5,384,181 A * | 1/1995 | Arthur et al. | ............ | 428/195.1 |
| 5,494,782 A | 2/1996 | Maenza et al. | ............ | 430/321 |
| 5,666,722 A | 9/1997 | Tamm et al. | ............ | 29/847 |
| 6,000,130 A | 12/1999 | Chang et al. | ............ | 29/852 |
| 6,035,527 A | 3/2000 | Tamm | ............ | 29/852 |
| 6,951,120 B2 | 10/2005 | McCaughan et al. | ............ | 65/392 |
| 7,028,400 B1 | 4/2006 | Hiner et al. | ............ | 29/852 |
| 7,080,448 B2 | 7/2006 | Wu et al. | ............ | 29/852 |
| 7,199,911 B2 | 4/2007 | Hudson et al. | | |
| 2001/0042733 A1 | 11/2001 | Appelt et al. | ............ | 216/13 |
| 2004/0252730 A1 | 12/2004 | McCaughan et al. | ............ | 372/6 |
| 2005/0112472 A1 | 5/2005 | Kutsch et al. | ............ | 430/1 |
| 2005/0231105 A1 | 10/2005 | Lovell et al. | ............ | 313/506 |
| 2006/0145146 A1 | 7/2006 | Suh et al. | | |
| 2007/0037065 A1 | 2/2007 | Kutsch et al. | ............ | 430/1 |

FOREIGN PATENT DOCUMENTS

| | | |
|---|---|---|
| TW | I288591 | 10/2007 |
| TW | 200805611 | 1/2008 |
| TW | I299646 | 8/2008 |

* cited by examiner

*Primary Examiner* — Carl Arbes
(74) *Attorney, Agent, or Firm* — J.C. Patents (57) ABSTRACT

A manufacturing method of circuit structure is described as follows. Firstly, a composite dielectric layer, a circuit board and an insulating layer disposed therebetween are provided. The composite dielectric layer includes a non-platable dielectric layer and a platable dielectric layer between the non-platable dielectric layer and the insulating layer wherein the non-platable dielectric layer includes a chemical non-platable material and the platable dielectric layer includes a chemical platable material. Then, the composite dielectric layer, the circuit board and the insulating layer are compressed. Subsequently, a through hole passing through the composite dielectric layer and the insulating layer is formed and a conductive via connecting a circuit layer of the circuit board is formed therein. Then, a trench pattern passing through the non-platable dielectric layer is formed on the composite dielectric layer. Subsequently, a chemical plating process is performed to form a conductive pattern in the trench pattern.

20 Claims, 8 Drawing Sheets

MANUFACTURING METHOD OF CIRCUIT STRUCTURE

CROSS-REFERENCE TO RELATED APPLICATION

This application claims the priority benefit of Taiwan application serial no. 98136682, filed on Oct. 29, 2009. The entirety of the above-mentioned patent application is hereby incorporated by reference herein and made a part of this specification.

BACKGROUND OF THE INVENTION

1. Field of the Invention

The present invention relates to a manufacturing method of a circuit structure, and more particularly, to a manufacturing method of a circuit structure for manufacturing a fine circuit.

2. Description of Related Art

Currently, with the rapid advancement of the fabrication techniques of the electronic industry, the circuit boards capable of carrying various electronic components are widely applied in the electronic products with various functionalities. Recently, the electronic products are developed with a trend toward multi-functional and small. Under this trend, it is necessary to increase the layout density of the circuit board to carry a lot of high-precision electronic components. Furthermore, the increasing of the layout density of the circuit board can be achieved by decreasing the line width and the line pitch.

In the conventional techniques, the method for forming the circuit layer comprises entirely electroplating a metal layer on the substrate and then patterning the metal layer by using the photolithography. However, the conventional techniques are limited by the uniformity of the metal layer formed by the electroplating process and the precision of the photolithography process. Hence, it is hard to fabricate the circuit with the line width smaller than 40 micrometers. Thus, the product yield is poor and the cost is high.

SUMMARY OF THE INVENTION

The invention provides a method for manufacturing a circuit structure having a relatively small line width.

The (present) invention provides a method for manufacturing a circuit structure and the method is described below. A composite dielectric layer, an insulating layer and a circuit board are provided. The insulating layer is located between the circuit board and the composite dielectric layer. The composite dielectric layer comprises a non-platable dielectric layer and a platable dielectric layer and the platable dielectric layer is located between the non-platable dielectric layer and the insulating layer. A material of the non-platable dielectric layer includes a chemical non-platable material and a material of the platable dielectric layer includes a chemical platable material. Then, the composite dielectric layer, the insulating layer and the circuit board are compressed. Thereafter, a through hole penetrating through the composite dielectric layer and the insulating layer is formed and the through hole exposes a portion of a circuit layer of the circuit board. Then, a conductive via is formed in the through hole and connected to the circuit layer. A trench pattern is formed on the composite dielectric layer, wherein the trench pattern penetrates through the non-platable dielectric layer. A first chemical plating process is performed so as to form a conductive pattern in the trench pattern and the conductive pattern is connected to the conductive via.

According to embodiment of the present invention, the method for patterning the composite dielectric layer comprises laser ablating the composite dielectric layer.

According to one embodiment of the present invention, the first chemical plating process comprises a chemical copper deposition process.

According to one embodiment of the present invention, the method for forming the circuit structure further comprises removing the non-platable dielectric layer after the conductive pattern is formed.

According to embodiment of the present invention, the method for forming the through hole comprises laser ablating the composite dielectric layer and the insulating layer.

According to one embodiment of the present invention, the method of forming the conductive via comprises performing a second chemical plating process.

According to one embodiment of the present invention, the trench pattern has a bottom portion and the bottom portion is composed of a portion of the platable dielectric layer.

According to one embodiment of the present invention, a catalyst used in the first chemical plating process does not adsorb on a surface of the non-platable dielectric layer.

According one embodiment of the present invention, a material of the non-platable dielectric layer comprises a polymer material without having any hydroxyl functional group (OH functional group) or carboxyl functional group (COOH functional group).

According to one embodiment of the present invention, the polymer material comprises epoxy resin, polyimide, liquid crystal polymer, methacrylate resin, vinyl phenyl resin, allyl resin, polyacrylate resin, polyether resin, polyolefin resin, polyamine resin, polysiloxane resin or the combination thereof.

According to one embodiment of the present invention, there is an interface between the conductive pattern and the conductive via and the interface protrudes from a surface of the insulating layer facing away from the circuit board.

The (present) invention provides a method for manufacturing a circuit structure and the method is described below. A composite layer, an insulating layer and the circuit board are provided. The insulating layer is located between the composite layer and the circuit board. The composite layer comprises a conductive layer and a platable dielectric layer, and the platable dielectric layer is located between the conductive layer and the insulating layer. Then, the composite layer, the insulating layer and the circuit board are compressed. Thereafter, a through hole penetrating through the composite dielectric layer and the insulating layer is formed and the through hole exposes a portion of a circuit layer of the circuit board. Then, a conductive via is formed in the through hole and connected to the circuit layer. The conductive layer is then removed. A non-platable dielectric layer is formed on the platable dielectric layer so that the platable dielectric layer and the non-platable dielectric layer together form a composite dielectric layer. A trench pattern is formed on the composite dielectric layer, wherein the trench pattern penetrates through the non-platable dielectric layer. A first chemical plating process is performed so as to form a conductive pattern in the trench pattern and the conductive pattern is connected to the conductive via.

According to one embodiment of the present invention, the method of forming the conductive via and the method of removing the conductive layer comprise forming a conductive material on the composite layer and the insulating layer to fill up the through hole after the through hole is formed, and then removing a portion of the conductive material outside the through hole and removing the conductive layer.

According to one embodiment of the present invention, the method of forming the conductive via and the method of removing the conductive layer comprise removing the conductive layer before the through hole is formed and forming a conductive material on the platable dielectric layer and the insulating layer after the through hole is formed to fill up the through hole, and then removing a portion of the conductive material outside the through hole.

According to one embodiment of the present invention, the method of forming the conductive via comprises performing a second chemical plating process.

According to embodiment of the present invention, the method for patterning the composite dielectric layer comprises laser ablating the composite dielectric layer.

According to one embodiment of the present invention, the first chemical plating process comprises a chemical copper deposition process.

According to one embodiment of the present invention, the method for forming the circuit structure further comprises removing the non-platable dielectric layer after the conductive pattern is formed.

According to embodiment of the present invention, the method for forming the through hole comprises laser ablating the composite layer and the insulating layer.

According to one embodiment of the present invention, the trench pattern has a bottom portion and the bottom portion is composed of a portion of the platable dielectric layer.

According to one embodiment of the present invention, a catalyst used in the first chemical plating process does not adsorb on a surface of the non-platable dielectric layer.

According one embodiment of the present invention, a material of the non-platable dielectric layer comprises a polymer material without having any hydroxyl functional group (OH functional group) or carboxyl functional group (COOH functional group).

According to one embodiment of the present invention, the polymer material comprises epoxy resin, polyimide, liquid crystal polymer, methacrylate resin, vinyl phenyl resin, allyl resin, polyacrylate resin, polyether resin, polyolefin resin, polyamine resin, polysiloxane resin or the combination thereof.

According to one embodiment of the present invention, there is an interface between the conductive pattern and the conductive via and the interface protrudes from a surface of the insulating layer facing away from the circuit board.

Accordingly, in the present invention, the non-platable dielectric layer having the chemical non-platable feature is configured on the platable dielectric layer. Further, the trench pattern is formed on the composite dielectric layer composed of the non-platable dielectric layer and the platable dielectric layer so that the platable dielectric layer is exposed by the trench pattern. Therefore, the conductive pattern is only formed on the platable dielectric layer exposed by the trench pattern by performing the chemical plating process. Hence, the conductive pattern only fills up the trench pattern. Hence, the conductive pattern can be defined by using the trench pattern. Further, the minimum line width of the conductive pattern formed in the trench pattern can be adjusted by controlling the minimum trench width of the trench pattern. Moreover, since the trench pattern of the present invention can be formed by laser ablation, the line width of the conductive pattern can be decreased (e.g. the minimum line width of the conductive pattern is smaller than 40 micrometers) without using the conventional lithography-etching process, the process yield is improved and the cost is decreased.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1G are schematic cross-sectional views showing a method forming a circuit structure according to one embodiment of the present invention.

Figure 1A:
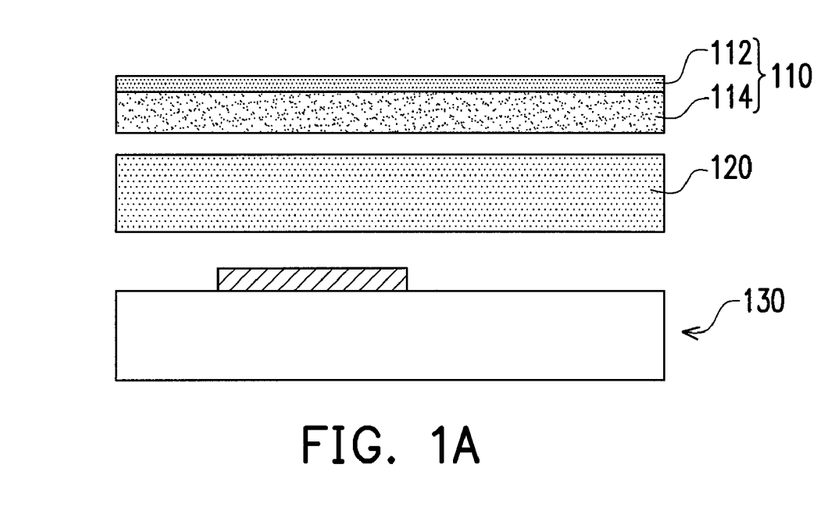
FIGS. 1A through 1G are schematic cross-sectional views showing a method forming a circuit structure according to one embodiment of the present invention.

As shown in FIG. 1A, a composite dielectric layer 110, an insulating layer 120 and a circuit board 130 are provided. The insulating layer 120 is located between the composite dielectric layer 110 and the circuit board 130. The circuit board 130 can be a single-layered plate or multi-layered plate. The insulating layer 120 can be, for example, a prepreg and the insulating layer 120 can have glass fiber. The material of the insulating layer 120 comprises epoxy resin and resin material containing Aramid functional groups. The composite dielectric layer 110 comprises a non-platable dielectric layer 112 and a platable dielectric layer 114. The platable dielectric layer 114 is located between the non-platable dielectric layer 112 and the insulating layer 120.

The material of the non-platable dielectric layer 112 comprises a chemical non-platable material. More specifically, in the present embodiment, the chemical non-platable material denotes the material incapable of adsorbing catalyst during the chemical plating process. The material of the non-platable dielectric layer 112 can be, for example, polymer material. The polymer material comprises epoxy resin, polyimide, liquid crystal polymer or the combination thereof. In the present embodiment, the material of the non-platable dielectric layer 112 can be a material which can be easily removed during laser ablation. In the present embodiment, the material of the non-platable dielectric layer 112 can be, for example, a polymer material without having any hydroxyl functional group (OH functional group) or carboxyl functional group (COOH functional group). That is, the polymer material is a hydrophobic polymer material. Further, the polymer material comprises epoxy resin, polyimide, liquid crystal polymer, methacrylate resin, vinyl phenyl resin, allyl resin, polyacrylate resin, polyether resin, polyolefin resin, polyamine resin, polysiloxane resin or the combination thereof.

The material of the platable dielectric layer 114 comprises a chemical platable material. More specifically, in the present embodiment, the chemical platable material denotes the material capable of adsorbing catalyst during the chemical plating process. The material of the platable dielectric layer 114 can be, for example, polymer material. The polymer material comprises epoxy resin, polyimide, liquid crystal polymer or the combination thereof. In the present embodiment, the material of the platable dielectric layer 114 comprises a laser-processable material.

Figure 1B:
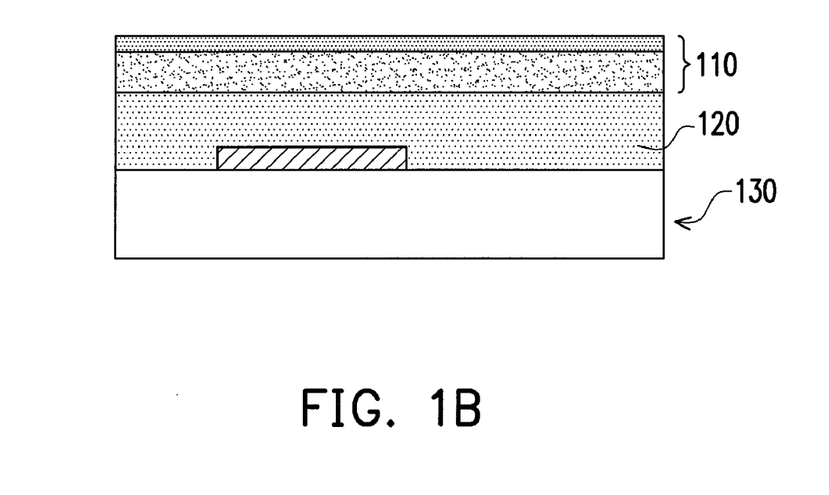
Figure 1C:
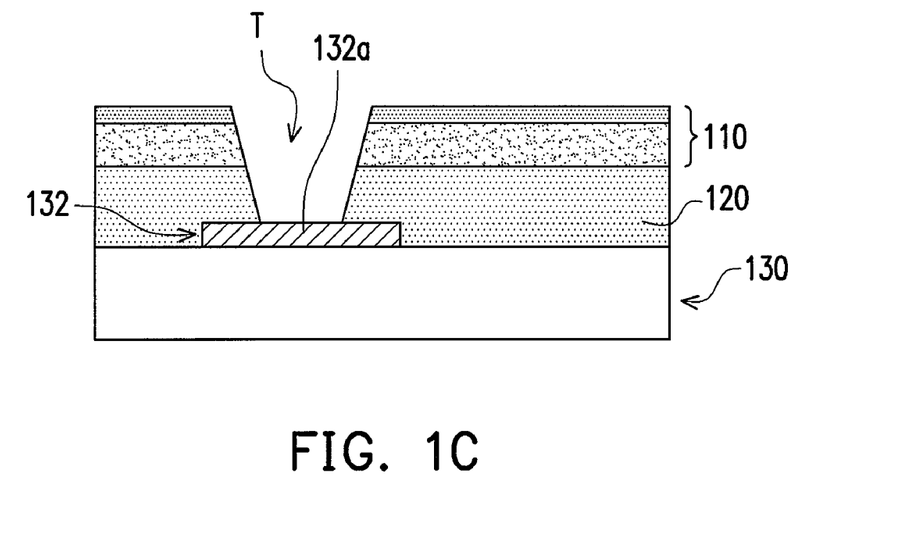

As shown in FIG. 1B, the composite dielectric layer 110, the insulating layer 120 and circuit board 130 are compressed to one another. As shown in FIG. 1C, for instance, a portion of the composite dielectric layer 110 and a portion of the insulating layer 120 are removed by laser ablation to form a through hole T penetrating through the composite dielectric layer 110 and the insulating layer 120. The through hole T exposes a portion of a circuit layer 132 of the circuit board 130 (e.g. a pad 132a of the circuit layer 132). Meanwhile, a desmear process can be optionally performed to remove the residue on the pad 132a (e.g. the residue of the removed portion of the composite dielectric layer 110 and the removed portion of the insulating layer 120).

Figure 1D:
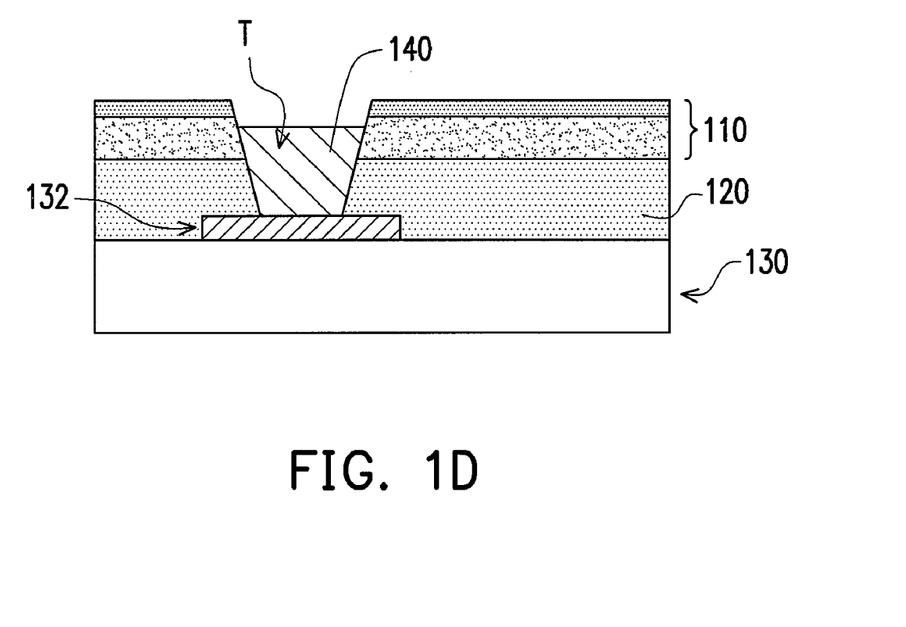
Figure 1E:
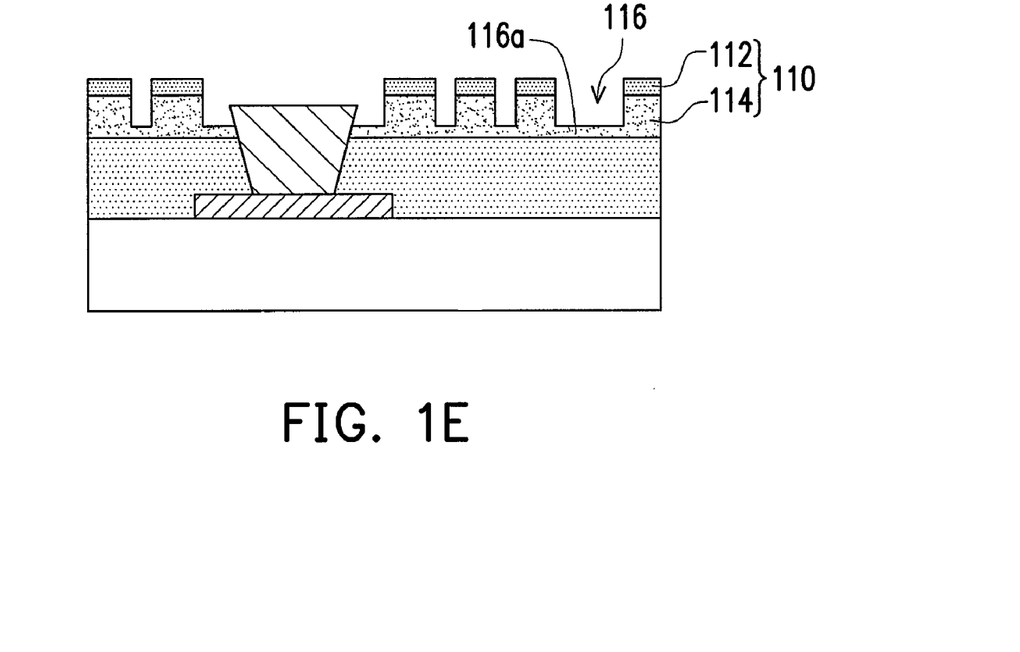

As shown in FIG. 1D, for instance, a chemical plating process is performed to form a conductive via 140 in the through hole T and the conductive via 140 is connected to the circuit layer 132. As shown in FIG. 1E, for instance, the composite dielectric layer 110 is patterned by laser ablation so as to form a trench pattern 116 penetrating through the non-platable dielectric layer 112 on the composite dielectric layer 110. The trench pattern 116 exposes the platable dielectric layer 114. In the present embodiment, the trench pattern 116 has a bottom portion 116a and the bottom portion 116a is composed of a portion of the platable dielectric layer 114. That is, the trench pattern 116 does not penetrate through the composite dielectric layer 110.

Figure 1F:
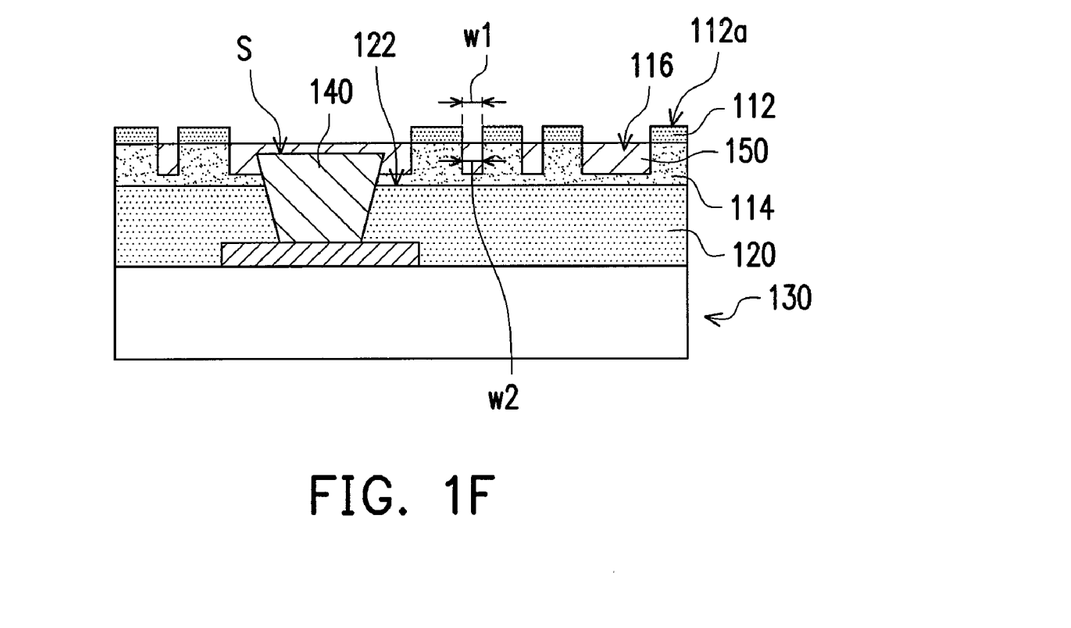

As shown in FIG. 1F, a chemical plating process is performed. A conductive pattern 150 is formed in the trench pattern 116 and the conductive pattern 150 is connected to the conductive via 140. The chemical plating process can be, for example, a chemical copper deposition process. The material of the conductive via 140 includes copper or other conductive materials. In the present embodiment, there is an interface S between the conductive pattern 150 and the conductive via 140 and the interface S protrudes from a surface 122 of the insulating layer 120 facing away from the circuit board 130.

It should be noticed that, in the chemical plating process, the surface 112a of the non-platable dielectric layer 112 does not adsorb any catalyst. Hence, the chemical plating process is performed to form the conductive pattern 150 only on the platable dielectric layer 114 exposed by the trench pattern 116. In the present embodiment, since the trench pattern 116 can be formed by laser ablation, the minimum trench width W1 (which is equal to the minimum line width W2 of the conductive pattern 150) of the trench pattern 116 can be smaller than or equal to 40 micrometers. Thus, it is not necessary to implement the photolithography process to pattern the conductive layer. Hence, the process yield can be improved and the cost can be decreased.

In the conventional subtractive process for manufacturing the circuit, the line width of the circuit is limited by the process ability such as the precision of the photolithography process and the etching process and is not easy to be decreased to be smaller than 40 micrometers so that the product yield is poor and the cost is high. By comparing with the conventional subtractive process, the present embodiment provides the method comprising forming the trench pattern 116 and then forming the circuit (i.e. the conductive pattern 150) in the trench pattern 116 so that the minimum trench width W1 of the trench pattern 116 is as same as the minimum line width W2 of the conductive pattern 150. Therefore, laser ablation can be adopted in the present embodiment to form the trench pattern 116 with the minimum trench width W1 smaller than 40 micrometers. Thus, the minimum line width W2 of the conductive pattern 150 can be smaller than 40 micrometers. Hence, by adopting the method of the present embodiment for manufacturing the circuit structure with the minimum line width W2 smaller than 40 micrometers, the product yield can be improved and the cost is decreased.

Figure 1G:
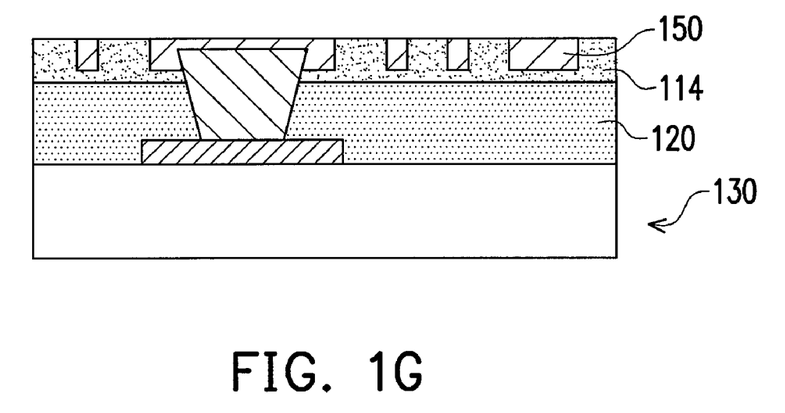

As shown in FIG. 1G, in the present embodiment, the non-platable dielectric layer 112 can be optionally removed.

FIGS. 2A through 2I are schematic cross-sectional views showing a method forming a circuit structure according to one embodiment of the present invention.

Figure 2A:
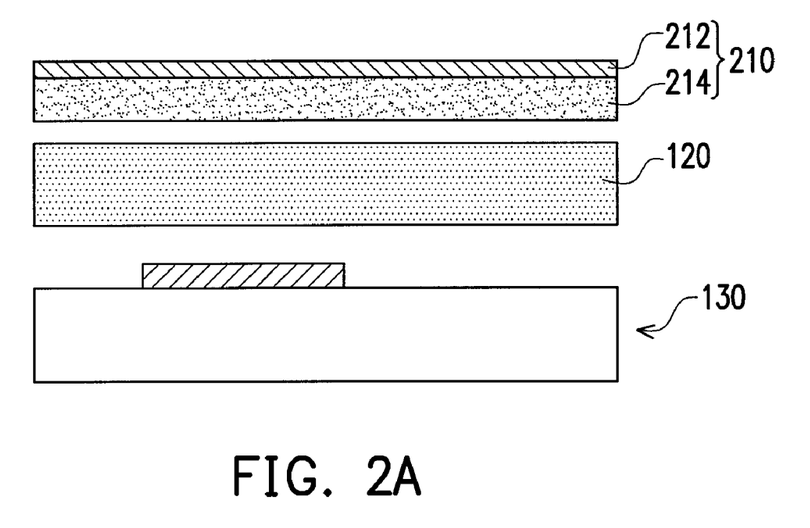
FIGS. 2A through 2I are schematic cross-sectional views showing a method forming a circuit structure according to one embodiment of the present invention.

As shown FIG. 2A, a composite layer 210, an insulating layer 120 and circuit board 130 are provided. The insulating layer 120 is located between the composite layer 210 and the circuit board 130. The composite layer 210 comprises a conductive layer 212 and a platable dielectric layer 214. The platable dielectric layer 214 is located between the conductive layer 212 and the insulating layer 120. The composite layer 210 can be, for example, a resin coated copper (RCC).

Figure 2B:
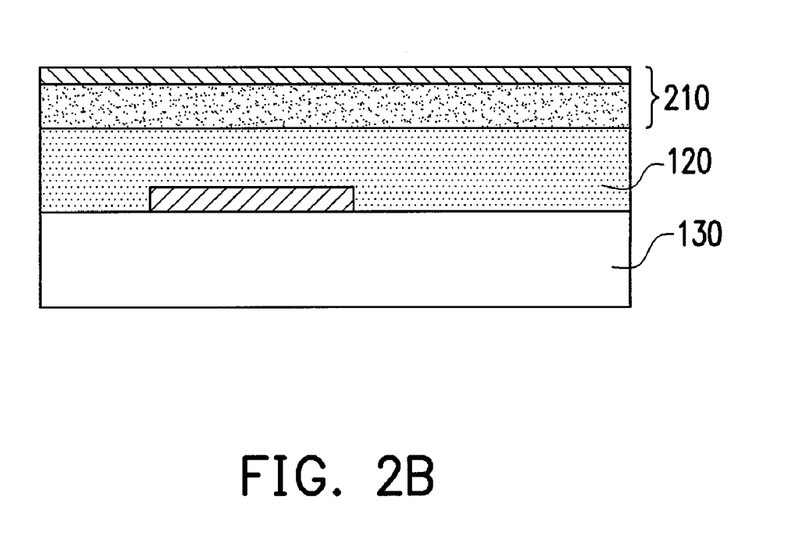
Figure 2C:
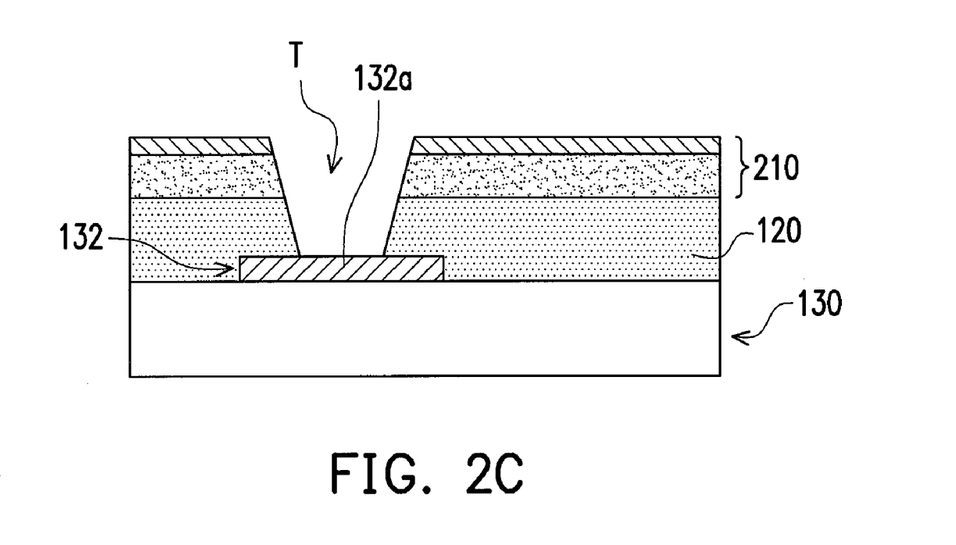

As shown in FIG. 2B, the composite layer 210, the insulating layer 120 and circuit board 130 are compressed to one another. As shown in FIG. 2C, for instance, a portion of the composite layer 210 and a portion of the insulating layer 120 are removed by laser ablation to form a through hole T penetrating through the composite layer 210 and the insulating layer 120. The through hole T exposes a portion of a circuit layer 132 of the circuit board 130 (e.g. a pad 132a of the circuit layer 132). Meanwhile, a desmear process can be selectively performed to remove the residue on the pad 132a (e.g. the residue of the removed portion of the composite layer 210 and the removed portion of the insulating layer 120).

Figure 2D:
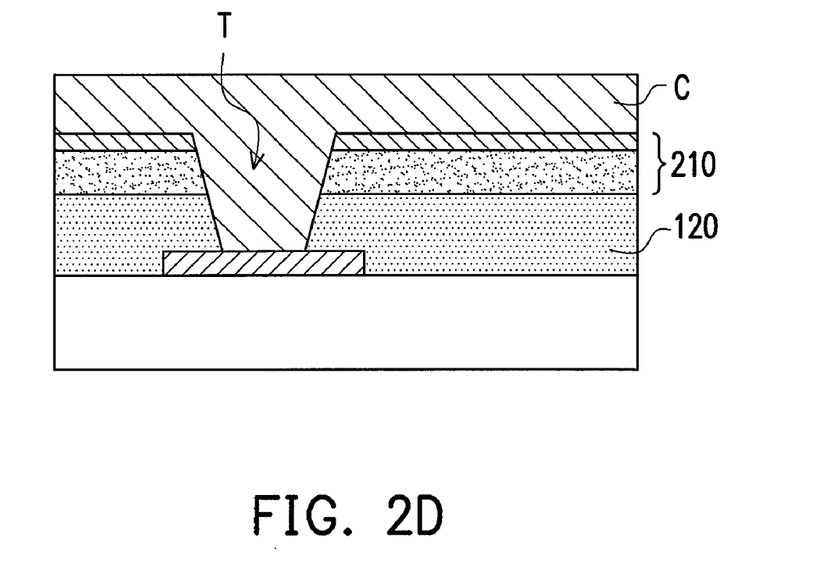

As shown in FIG. 2D, in the present embodiment, a chemical plating process is performed to entirely form a conductive material C on the composite layer 210 and the insulating layer 120 and a portion of the conductive material C fills up the through hole T.

Figure 2E:
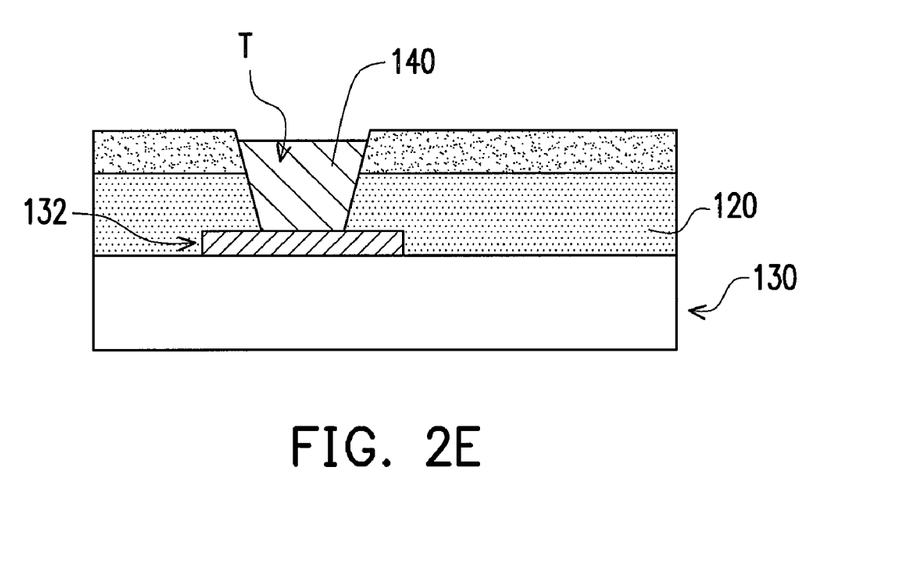

As shown in FIG. 2E, a portion of the conductive material C outside the through hole T and the conductive layer 212 are removed so as to form a conductive via 140 in the through hole T. The conductive via 140 is connected to a circuit layer 132 of the circuit board 130. In the other embodiment, the method of removing the conductive layer 212 can be performed before the through hole T is formed. In other words, the conductive layer 212 can be removed before or after the through hole T is formed.

Figure 2F:
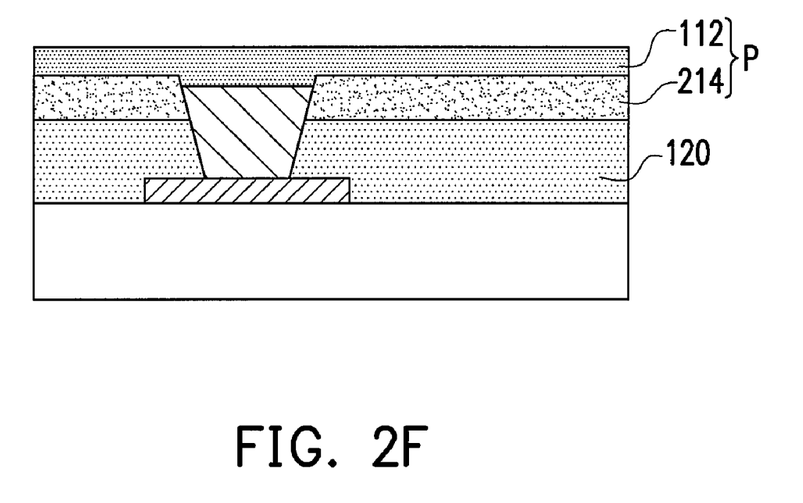

As shown in FIG. 2F, a non-platable dielectric layer 112 is formed on the platable dielectric layer 214 so that the platable dielectric layer 214 and the non-platable dielectric layer 112 together form a composite dielectric layer P. The method for forming the non-platable dielectric layer 112 includes compressing process. Further, the non-platable dielectric layer 112 can be, for example, a dry film or a wet film. In the present embodiment, the material of the non-platable dielectric layer 112 can be, for example, a polymer material without having any hydroxyl functional group (OH functional group) or carboxyl functional group (COOH functional group). That is, the polymer material is a hydrophobic polymer material. Further, the polymer material comprises epoxy resin, polyimide, liquid crystal polymer, methacrylate resin, vinyl phenyl resin, allyl resin, polyacrylate resin, polyether resin, polyolefin resin, polyamine resin, polysiloxane resin or the combination thereof.

Figure 2G:
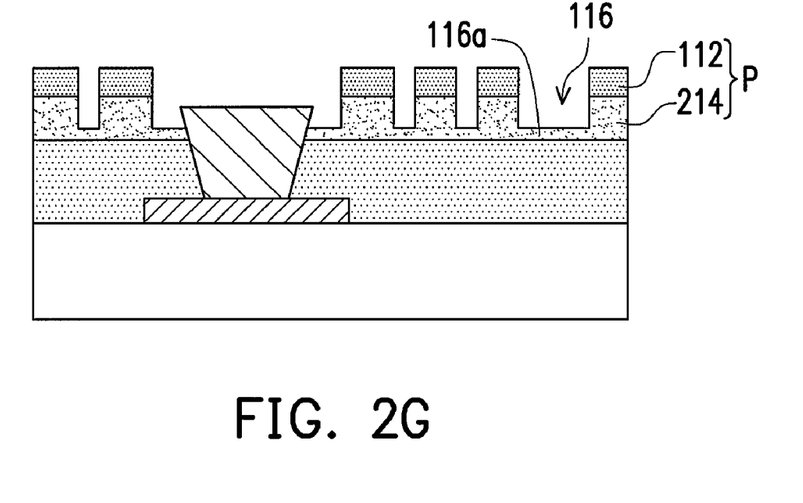

As shown in FIG. 2G, for instance, the composite layer P is patterned by laser ablation so as to form a trench pattern 116 penetrating through the non-platable dielectric layer 112 on the composite layer P. The trench pattern 116 exposes the platable dielectric layer 214. It should be noticed that, in the present embodiment, the trench pattern 116 has a bottom portion 116a and the bottom portion 116a is composed of a portion of the platable dielectric layer 214. That is, the trench pattern 116 does not penetrate through the composite layer P.

Figure 2H:
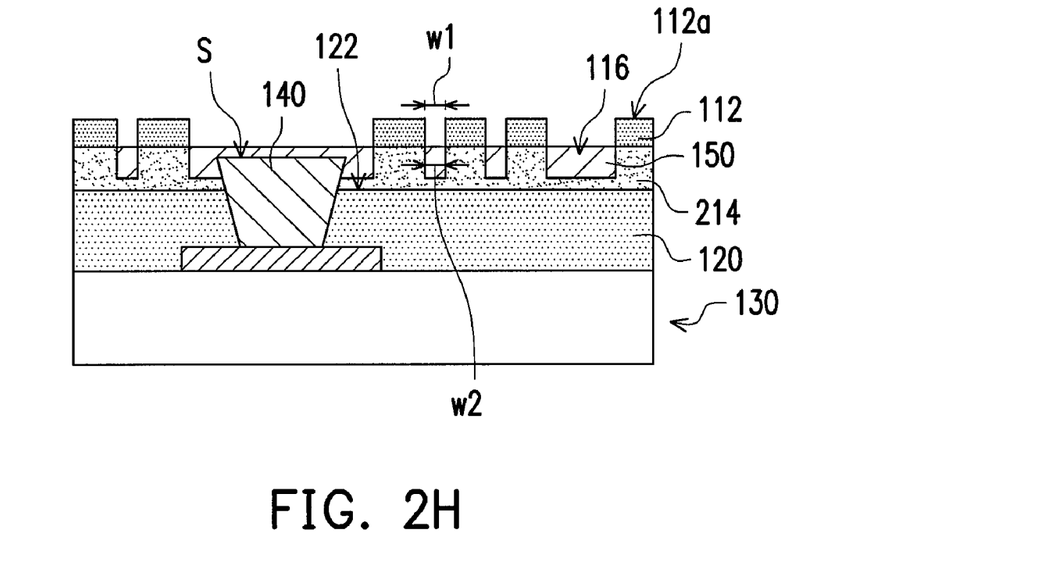

As shown in FIG. 2H, a chemical plating process is performed. A conductive pattern 150 is formed in the trench pattern 116 and the conductive pattern 150 is connected to the conductive via 140. The chemical plating process can be, for example, a chemical copper deposition process. The material of the conductive pattern 150 includes copper or other conductive materials. In the present embodiment, there is an interface S between the conductive pattern 150 and the conductive via 140 and the interface S protrudes from a surface 122 of the insulating layer 120 facing away from the circuit board 130.

It should be noticed that, in the chemical plating process, the surface 112a of the non-platable dielectric layer 112 does not adsorb any catalyst. Hence, the chemical plating process is performed to form the conductive pattern 150 only on the platable dielectric layer 214 exposed by the trench pattern 116. Thus, the conductive pattern 150 only fills up the trench pattern 116. Hence, the conductive pattern 150 can be defined by using the trench pattern 116. Further, the minimum line width of the conductive pattern 150 formed in the trench pattern 116 can be adjusted by controlling the minimum trench width of the trench pattern 116. In the present embodiment, since the trench pattern 116 can be formed by laser ablation, the minimum trench width W1 (which is equal to the minimum line width W2 of the conductive pattern 150) of the trench pattern 116 can be smaller than or equal to 40 micrometers. Thus, it is not necessary to implement the photolithography process and the etching process to pattern the conductive layer. Hence, the process yield can be improved and the cost can be decreased.

Figure 2I:
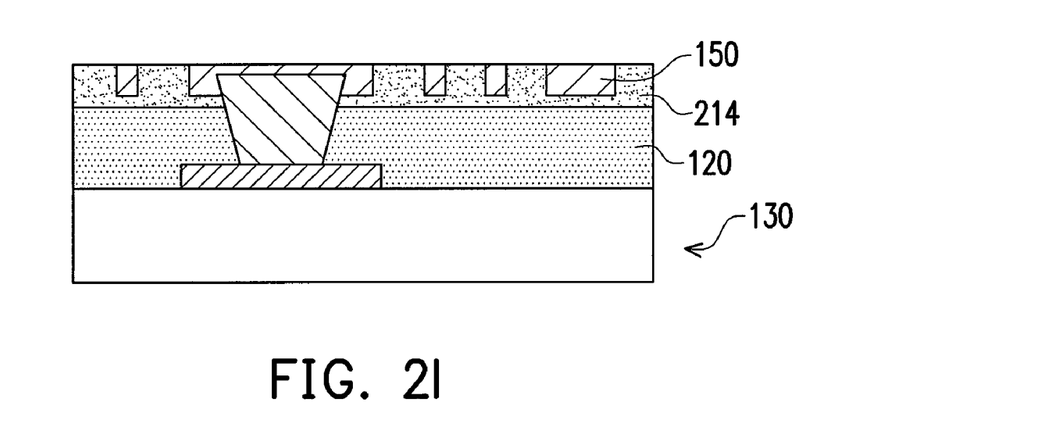

As shown in FIG. 2I, in the present embodiment, the non-platable dielectric layer 112 can be selectively removed.

Accordingly, in the present invention, the non-platable dielectric layer having the chemical non-platable feature is configured on the platable dielectric layer. Further, the trench pattern is formed on the composite dielectric layer composed of the non-platable dielectric layer and the platable dielectric layer so that the platable dielectric layer is exposed by the trench pattern. Therefore, the conductive pattern is only formed on the platable dielectric layer exposed by the trench pattern by performing the chemical plating process. Hence, the conductive pattern only fills up the trench pattern. Hence, the conductive pattern can be defined by using the trench pattern. Further, the minimum line width of the conductive pattern formed in the trench pattern can be adjusted by controlling the minimum trench width of the trench pattern. Moreover, since the trench pattern of the present invention can be formed by laser ablation, the line width of the conductive pattern can be decreased. Thus, it is not necessary to implement the photolithography process and the etching process to pattern the conductive layer. Hence, the process yield is improved and the cost is decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a circuit structure, comprising:
providing a composite dielectric layer, an insulating layer and a circuit board, wherein the insulating layer is located between the circuit board and the composite dielectric layer, the composite dielectric layer comprises a non-platable dielectric layer and a platable dielectric layer, the platable dielectric layer is located between the non-platable dielectric layer and the insulating layer, a material of the non-platable dielectric layer includes a chemical non-platable material, and a material of the platable dielectric layer includes a chemical platable material;
compressing the composite dielectric layer, the insulating layer and the circuit board;
forming a through hole penetrating through the composite dielectric layer and the insulating layer, wherein the through hole exposes a portion of a circuit layer of the circuit board;
forming a conductive via in the through hole, wherein the conductive via is connected the circuit layer;
forming a trench pattern on the composite dielectric layer, wherein the trench pattern penetrates through the non-platable dielectric layer; and
performing a first chemical plating process so as to form a conductive pattern in the trench pattern, wherein the conductive pattern is connected to the conductive via.

2. The method of claim 1, wherein the method of patterning the composite dielectric layer comprises laser ablating the composite dielectric layer.

3. The method of claim 1 further comprising:
removing the non-platable dielectric layer after the conductive pattern is formed.

4. The method of claim 1, wherein the method of forming the through hole comprises laser ablating the composite dielectric layer and the insulating layer.

5. The method of claim 1, wherein the method of forming the conductive via comprises performing a second chemical plating process.

6. The method of claim 1, wherein the trench pattern has a bottom portion and the bottom portion is composed of a portion of the platable dielectric layer.

7. The method of claim 1, wherein, a catalyst used in the first chemical plating process dose not adsorb on a surface of the non-platable dielectric layer.

8. The method of claim 1, wherein a material of the non-platable dielectric layer includes a polymer material without having any hydroxyl functional group or carboxyl functional group.

9. The method of claim 1, wherein there is an interface between the conductive pattern and the conductive via and the interface protrudes from a surface of the insulating layer facing away from the circuit board.

10. A method for forming a circuit structure, comprising:
providing a composite layer, an insulating layer and a circuit board, wherein the insulating layer is located between the composite layer and the circuit board, the composite layer comprises a conductive layer and a platable dielectric layer, and the platable dielectric layer is located between the conductive layer and the insulating layer;
compressing the composite layer, the insulating layer and the circuit board;
forming a through hole penetrating through the composite layer and the insulating layer, wherein the through hole exposes a portion of a circuit layer of the circuit board;
forming a conductive via in the through hole, wherein the conductive via is connected the circuit layer;
removing the conductive layer;
forming a non-platable dielectric layer on the platable dielectric layer so that the platable dielectric layer and the non-platable dielectric layer together form a composite dielectric layer;

forming a trench pattern on the composite dielectric layer, wherein the trench pattern penetrates through the non-platable dielectric layer; and performing a first chemical plating process so as to form a conductive pattern in the trench pattern, wherein the conductive pattern is connected to the conductive via.

11. The method of claim 10, wherein the method of forming the conductive via and the method of removing the conductive layer comprise:

forming a conductive material on the composite layer and the insulating layer after the through hole is formed, wherein a portion of the conductive material fill up the through hole; and removing a portion of the conductive material outside the through hole and removing the conductive layer.

12. The method of claim 10, wherein the method of forming the conductive via and the method of removing the conductive layer comprise:

removing the conductive layer before the through hole is formed;

entirely forming a conductive material on the platable dielectric layer and the insulating layer after the through hole is formed, wherein a portion of the conductive material fill up the through hole; and removing a portion of the conductive material outside the through hole.

13. The method of claim 10, wherein the method of forming the conductive via comprises performing a second chemical plating process.

14. The method of claim 10, wherein the method of patterning the composite dielectric layer comprises laser ablating the composite dielectric layer.

15. The method of claim 10 further comprising:

removing the non-platable dielectric layer after the conductive pattern is formed.

16. The method of claim 10, wherein the method of forming the through hole comprises laser ablating the composite layer and the insulating layer.

17. The method of claim 10, wherein the trench pattern has a bottom portion and the bottom portion is composed of a portion of the platable dielectric layer.

18. The method of claim 10, wherein a catalyst used in the first chemical plating process dose not adsorb on a surface of the non-platable dielectric layer.

19. The method of claim 10, wherein a material of the non-platable dielectric layer includes a polymer material without having any hydroxyl functional group or carboxyl functional group.

20. The method of claim 10, wherein there is an interface between the conductive pattern and the conductive via and the interface protrudes from a surface of the insulating layer facing away from the circuit board.

* * * * *